(12) United States Patent
Wilcox

(10) Patent No.: US 7,618,163 B2
(45) Date of Patent: Nov. 17, 2009

(54) LIGHT-DIRECTING LED APPARATUS

(75) Inventor: Kurt S. Wilcox, Libertyville, IL (US)

(73) Assignee: Ruud Lighting, Inc., Racine, WI (US)

(*) Notice: Subject to any disclaimer, the term of this patent is extended or adjusted under 35 U.S.C. 154(b) by 62 days.

(21) Appl. No.: 11/695,483

(22) Filed: Apr. 2, 2007

(65) Prior Publication Data
US 2008/0239722 A1   Oct. 2, 2008

(51) Int. Cl.
*F21V 5/00* (2006.01)
(52) U.S. Cl. .............. 362/336; 362/268; 362/326; 362/335; 362/800
(58) Field of Classification Search .......... 362/268, 362/326, 335, 336, 800
See application file for complete search history.

(56) References Cited

U.S. PATENT DOCUMENTS

| | | |
|---|---|---|
| 1,404,004 A | 1/1922 | Benford |
| 1,535,486 A | 4/1925 | Lundy |
| 3,497,687 A | 2/1970 | Hermann |
| 3,625,615 A | 12/1971 | Wilson |
| 4,254,453 A | 3/1981 | Mouyard et al. |
| 4,336,580 A | 6/1982 | Mouyard et al. |
| 4,345,308 A | 8/1982 | Mouyard et al. |
| 4,650,998 A | 3/1987 | Martin |
| 4,767,172 A | 8/1988 | Nichols et al. |
| 4,845,600 A | 7/1989 | Matsumura et al. |
| 4,862,330 A | 8/1989 | Machida et al. |
| 4,935,665 A | 6/1990 | Murata |
| 5,001,609 A | 3/1991 | Gardner et al. |
| 5,013,144 A | 5/1991 | Silverglate et al. |
| 5,014,165 A | 5/1991 | Naganawa |
| 5,062,027 A | 10/1991 | Machida et al. |
| 5,127,728 A | 7/1992 | Warren et al. |
| 5,174,649 A | 12/1992 | Alston |
| RE34,254 E | 5/1993 | Dragoon |
| 5,289,082 A | 2/1994 | Komoto |
| 5,349,504 A | 9/1994 | Simms et al. |

(Continued)

FOREIGN PATENT DOCUMENTS

EP   1 107 210   6/2001

(Continued)

OTHER PUBLICATIONS

Future Lighting Solutions. "The 6 Steps to LED Lighting Success" brochure. Date: undated. 6 pages.

*Primary Examiner*—Sandra L O'Shea
*Assistant Examiner*—Meghan K Dunwiddie
(74) *Attorney, Agent, or Firm*—Jansson, Shupe & Munger Ltd.

(57) ABSTRACT

LED apparatus for illumination toward a preferential side, including a light emitter having at least one LED on a base, a primary lens positioned over the light emitter and having a central axis, and a secondary lens placed with an inner surface surrounding the primary lens. The secondary lens has a base-adjacent lower end defining a main plane substantially perpendicular to the central axis, and a compound outer lens surface with a middle-region reference point defining a reference axis parallel to the central axis. The compound outer lens surface includes (A) a principal perimeter surface centered on the preferential side, the principal perimeter surface (a) projecting to a ridgeline subtending a substantial angle about the central axis, and (b) terminating inwardly at the ridgeline, (B) a middle region containing the reference point and having a concavity thereabout, and (C) a non-principal perimeter surface centered on the non-preferential side and adjoining the middle region and the principal perimeter surface.

38 Claims, 11 Drawing Sheets

U.S. PATENT DOCUMENTS

| | | |
|---|---|---|
| 5,592,578 A | 1/1997 | Ruh |
| 5,784,209 A | 7/1998 | Manabe |
| 5,813,752 A | 9/1998 | Singer et al. |
| 5,865,529 A | 2/1999 | Yan |
| 5,995,291 A | 11/1999 | Togino |
| 6,097,549 A | 8/2000 | Jenkins et al. |
| 6,229,160 B1 | 5/2001 | Krames et al. |
| 6,244,727 B1 | 6/2001 | Ryan, Jr. et al. |
| 6,250,787 B1 | 6/2001 | Matubara |
| 6,273,596 B1 | 8/2001 | Parkyn, Jr. |
| 6,274,924 B1 | 8/2001 | Carey et al. |
| 6,283,613 B1 | 9/2001 | Schaffer |
| 6,296,376 B1 | 10/2001 | Kondo et al. |
| 6,323,063 B2 | 11/2001 | Krames et al. |
| 6,361,190 B1 | 3/2002 | McDermott |
| 6,361,192 B1 | 3/2002 | Fussell et al. |
| 6,443,594 B1 | 9/2002 | Marshall et al. |
| 6,473,238 B1 | 10/2002 | Daniell |
| 6,481,130 B1 | 11/2002 | Wu |
| 6,498,355 B1 | 12/2002 | Harrah et al. |
| 6,502,956 B1 | 1/2003 | Wu |
| 6,504,301 B1 | 1/2003 | Lowery |
| 6,541,800 B2 | 4/2003 | Barnett et al. |
| 6,547,423 B2 | 4/2003 | Marshall et al. |
| 6,550,940 B2 | 4/2003 | Kamiya et al. |
| 6,554,451 B1 | 4/2003 | Keuper |
| 6,570,190 B2 | 5/2003 | Krames et al. |
| 6,598,998 B2 | 7/2003 | West et al. |
| 6,601,962 B1 | 8/2003 | Ehara et al. |
| 6,607,286 B2 | 8/2003 | West et al. |
| 6,616,299 B2 | 9/2003 | Martineau |
| 6,637,921 B2 | 10/2003 | Coushaine |
| 6,679,621 B2 | 1/2004 | West et al. |
| 6,682,211 B2 | 1/2004 | English et al. |
| 6,721,101 B2 | 4/2004 | Daniell |
| 6,730,940 B1 | 5/2004 | Steranka et al. |
| 6,808,293 B2 | 10/2004 | Watanabe et al. |
| 6,837,605 B2 | 1/2005 | Reill |
| 6,846,101 B2 | 1/2005 | Coushaine |
| 6,851,835 B2 | 2/2005 | Smith et al. |
| 6,903,376 B2 | 6/2005 | Shen et al. |
| 6,918,677 B2 | 7/2005 | Shipman |
| 6,924,943 B2 | 8/2005 | Manano et al. |
| 6,929,384 B2 | 8/2005 | Watanabe et al. |
| 6,948,840 B2 | 9/2005 | Grenda et al. |
| 6,955,451 B2 | 10/2005 | Coushaine et al. |
| 6,987,613 B2 | 1/2006 | Pocius et al. |
| 6,991,355 B1 | 1/2006 | Coushaine et al. |
| 6,995,402 B2 | 2/2006 | Ludowise et al. |
| 7,009,213 B2 | 3/2006 | Camras et al. |
| 7,042,021 B2 | 5/2006 | Isoda |
| 7,053,419 B1 | 5/2006 | Camras et al. |
| 7,063,441 B2 | 6/2006 | Kramer et al. |
| 7,063,450 B2 | 6/2006 | Ehara et al. |
| 7,064,355 B2 | 6/2006 | Camras et al. |
| 7,080,932 B2 | 7/2006 | Keuper |
| 7,083,313 B2 | 8/2006 | Smith |
| 7,106,523 B2 | 9/2006 | McLean et al. |
| 7,111,972 B2 | 9/2006 | Coushaine et al. |
| 7,114,838 B2 | 10/2006 | Wu |
| 7,118,236 B2 | 10/2006 | Hahm et al. |
| 7,118,262 B2 | 10/2006 | Negley |
| 7,121,691 B2 | 10/2006 | Coushaine et al. |
| 7,125,143 B2 | 10/2006 | Hacker |
| 7,125,160 B2 | 10/2006 | Wong et al. |
| 7,150,553 B2 | 12/2006 | English et al. |
| 7,153,000 B2 | 12/2006 | Park et al. |
| 7,172,324 B2 | 2/2007 | Wu et al. |
| 7,182,497 B2 | 2/2007 | Lee et al. |
| 2003/0099115 A1* | 5/2003 | Reill ........................ 362/555 |
| 2004/0037076 A1 | 2/2004 | Katoh et al. |
| 2004/0212291 A1 | 10/2004 | Keuper |
| 2005/0083699 A1 | 4/2005 | Rhoads et al. |
| 2005/0179041 A1 | 8/2005 | Harbers et al. |
| 2005/0224826 A1 | 10/2005 | Keuper et al. |
| 2005/0281047 A1 | 12/2005 | Coushaine et al. |
| 2006/0013000 A1 | 1/2006 | Coushaine et al. |
| 2006/0013002 A1 | 1/2006 | Coushaine et al. |
| 2006/0039143 A1 | 2/2006 | Katoh et al. |
| 2006/0105482 A1 | 5/2006 | Alferink et al. |
| 2006/0181902 A1 | 8/2006 | Tamura et al. |
| 2006/0186431 A1 | 8/2006 | Miki et al. |
| 2006/0198144 A1 | 9/2006 | Miyairi et al. |
| 2007/0201225 A1 | 8/2007 | Holder et al. |
| 2008/0048200 A1* | 2/2008 | Mueller et al. ................ 257/98 |

FOREIGN PATENT DOCUMENTS

| | | |
|---|---|---|
| JP | 60-199746 | 10/1985 |
| JP | 61-160328 | 7/1986 |
| WO | WO2006/111805 | 10/2006 |

* cited by examiner

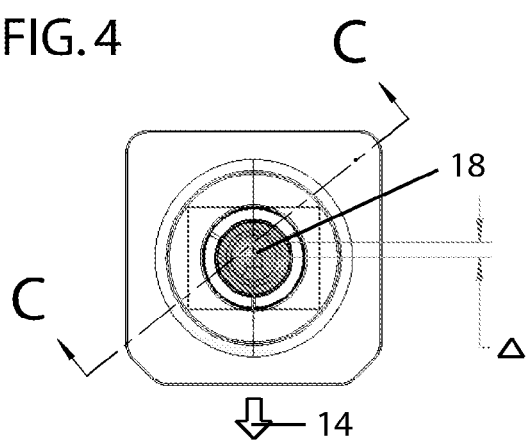
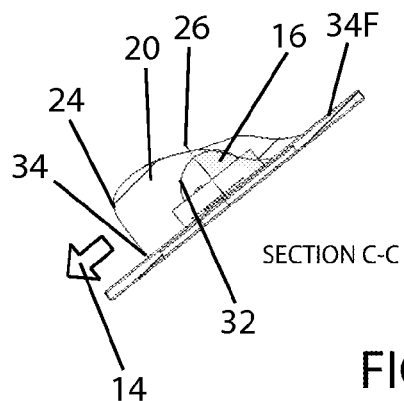
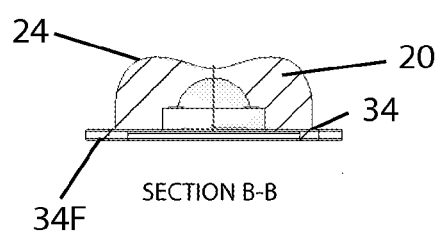
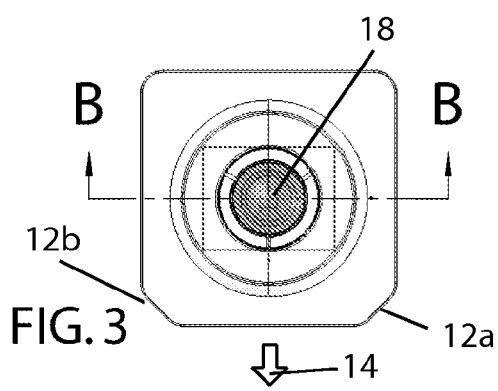
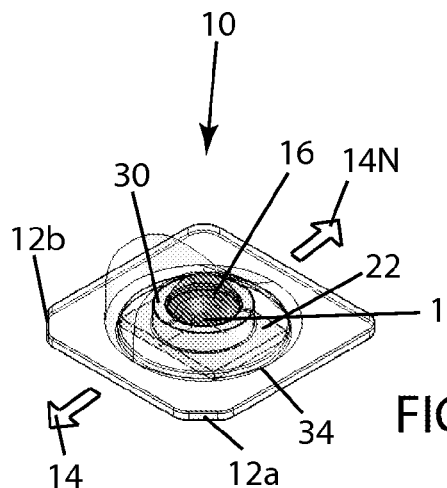
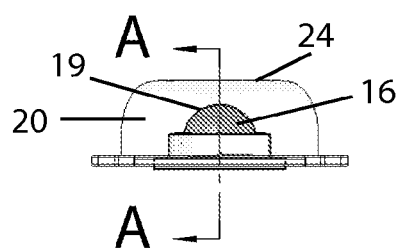
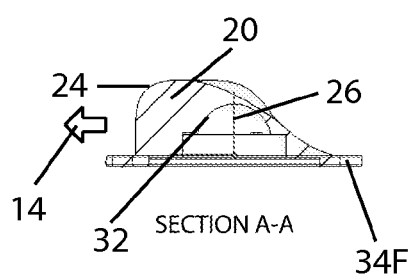

LIGHT-DIRECTING LED APPARATUS

FIELD OF THE INVENTION

The invention relates generally to the field of lighting systems and, more particularly, to apparatus for utilizing LED light sources for illuminating areas with a predefined pattern of light intensity.

BACKGROUND OF THE INVENTION

There is a need for lighting apparatus which is low-cost and energy efficient. LEDs (light-emitting diodes) provide light sources which are energy efficient, and advances in LED technology are providing even greater such efficiencies over time. In addition, one advantage of using LEDs as light sources is simply that the smaller packages of such sources translate into much lower material usage within fixtures containing such sources, thus yielding the attendant cost-efficiency. As the technology advances and the cost of LED packages is reduced, such material usage cost benefits will become more important.

Typical applications for lighting systems are roadway and parking lot lighting in which there are performance requirements that light be as uniformly distributed over areas which are to be lighted while the neighboring regions should be free of light spillage. Thus, along roadways and in parking lots, there is a need to be able to direct light in a laterally-biased direction to avoid so-called trespass lighting on neighboring houses, for example, while providing uniform lighting to the roadways or parking lots.

Various LED packages have lenses, some including secondary lenses, for various purposes not related to preferential lateral directing of light. In addition, some limited efforts have been made to develop light-directing LED apparatus using small lenses over small LED light emitter packages, and utilizing lenses intended to redirect some amount of emitted light to one side preferentially. However, such lenses, utilizing lens surfaces having one or more projecting elements and extensive regions of discontinuity, fall well short of requirements to avoid trespass lighting. The measure of trespass lighting includes more than just the amount of light energy falling toward the non-preferential side but also includes how far into the area on the non-preferential that the light falls.

The requirements for avoiding trespass lighting may even indicate in some applications that it is preferable to absorb light rather than to allow it to be emitted into the area on the non-preferential side.

OBJECTS OF THE INVENTION

It is an object of this invention, in the field of lighting systems, to provide LED lighting apparatus which directs light in a laterally-biased direction from the apparatus and which overcomes some of the problems and shortcomings of the prior art.

Another object of this invention is to provide LED light-directing apparatus which directs light toward a preferential side while directing little light toward the non-preferential (opposite) side.

Another object of this invention is to provide LED light-directing apparatus which maximizes the light directed toward a preferential side and minimizes light directed toward the non-preferential side.

Another object of this invention is to provide LED light-directing apparatus which minimizes trespass lighting by minimizing the distance into the area on the non-preferential side that light is directed.

Another object of this invention is to provide LED light-directing apparatus which uniformly distributes light over an area on a preferential side when mounted above the area to be lighted.

Another object of this invention is to provide LED light-directing apparatus which directs a maximum amount of light with only a single refraction to achieve improved control of the directed light.

Still another object of this invention is to provide LED light-directing apparatus which, when used in conjunction with other such apparatus to illuminate a larger area, uniformly distributes light over the area on a preferential side of the plurality of such apparatus.

Yet another object of this invention is to provide LED light-directing apparatus which directs light in the above fashion in a cost-effective manner.

These and other objects of the invention will be apparent from the following descriptions and the drawings.

SUMMARY OF THE INVENTION

The term "downward" is used herein for convenience in describing the invention and aspects thereof, but does not in any way mandate usage of the apparatus in any orientation. In other words, "downward" is not limited by the direction of gravity. Thus, if a light fixture incorporating the inventive light-directing LED apparatus disclosed herein is oriented "upward" rather than downward, or in some laterally-oriented direction, the term "downward" subsumes such meanings. The term "downward" has been used since one important application for the inventive apparatus is the lighting of ground surfaces from vertical light poles. Note that the figures primarily show such "downward" direction as generally upward since visualization of the compound outer lens surface of the secondary lens in perspective is best viewed for clarity in such orientation. Note is made when such directions are referred to in the context of a figure.

The term "reference-axis half-plane" refers to each of the infinite number of planes extending from the reference axis in one direction such that the reference axis is at the edge of the half-plane.

The phrase "subtending a substantial angle about" as used herein means that the angle subtended is at least about 90°, although angles greater than about 150° are more useful for numerous lighting applications. Still more preferred, particularly for applications such as roadway lighting, are angles of about 180°, with angles somewhat greater than 180° being most preferred.

The term "ridgeline" as used herein may also include a set of points in a region rather than just a line of points, as long as the points in the set satisfy the definition of the ridgeline as defined herein. Such a situation occurs when the slope along the compound outer lens surface in radial directions to/from the reference axis is parallel to the main plane as defined herein within a section of such curves along the surface rather than simply at single points along such curves. In other words, points in such a region all lie in a plane parallel to the main plane within such region of the compound outer lens surface.

The invention is LED apparatus for illumination toward a preferential side in a downward and outward direction. The inventive apparatus includes: (1) a light emitter having at least one LED on a base; (2) a primary lens positioned over the light emitter and having a central axis; and (3) a secondary lens placed with an inner surface surrounding the primary lens. The secondary lens has a base-adjacent lower end defining a main plane substantially perpendicular to the central axis and a compound outer lens surface with a middle-region reference point defining a reference axis parallel to the central axis. (It should be understood that the term "lower," as used in reference to the base-adjacent end, is chosen because the lens orientation, as illustrated in FIGS. 1-4, 8, 9, 11-17 and 21, has the base below the majority of the structure. As is apparent, when the lens is oriented for illumination in the downward direction (as is the case in normal usage of the product), the base-adjacent end is in an upper position, not a lower position. Regardless of orientation, the end can be referred to as the "base-adjacent end." The term "lower," however, is used at a number of points in this application for the reasons just given.) The compound outer lens surface includes a principal perimeter surface centered on the preferential side, the principal perimeter surface (a) projecting from the base-adjacent end downwardly and inwardly to a ridgeline defined by the set of outer-lens-surface points in each reference-axis half-plane that are farthest from the main plane and spaced from the reference point, the ridgeline subtending a substantial angle about the central axis, and (b) terminating inwardly at the ridgeline. The compound outer lens surface also includes a middle region which is inward of the ridgeline, contains the middle-region reference point, and has a concavity thereabout. The compound outer lens surface further includes a non-principal perimeter surface which is centered on the non-preferential side and adjoins the middle region and the principal perimeter surface.

In preferred embodiments, the reference axis is offset from the central axis toward the non-preferential side. (While the reference axis can be coincident with the central axis or offset toward the preferential side, it is preferable that the reference axis is offset from the central axis toward the non-preferential side.)

In certain preferred embodiments, the ridgeline subtends an angle greater than 180° about the central axis.

In some embodiments, there is only a single ridgeline point in each reference-axis half-plane intersecting the principal perimeter surface.

In certain preferred embodiments of the inventive apparatus, the principal perimeter surface is bilaterally symmetric, and in some embodiments, the non-principal perimeter surface is bilaterally symmetric. Further, in some preferred embodiments, the compound outer lens surface is bilaterally symmetric.

In some preferred embodiments, there is space between the primary and secondary lenses and the space is filled with optical-grade gel.

In certain embodiments, the primary lens has an illumination pattern which is substantially rotationally symmetrical around the central axis, and in certain embodiments, the primary lens is substantially hemispherical.

In highly-preferred embodiments, the compound outer lens surface is shaped by (a) a plurality of spaced-apart target lens design curves in reference-axis half-planes and (b) surfaces which smoothly match the plurality of target lens design curves between the curves. The target lens design curves terminate at the middle-region reference point and the lower end.

In some embodiments, the inventive apparatus includes: a light emitter having at least one LED on a base and a lens positioned over the light emitter and having a central axis, a base-adjacent lower end defining a main plane substantially perpendicular to the central axis, and a compound outer lens surface with a middle-region reference point defining a reference axis parallel to the central axis. The compound outer lens surface includes a principal perimeter surface centered on the preferential side, the principal perimeter surface (a) projecting from the lower end downwardly and inwardly to a ridgeline defined by the set of outer-lens-surface points in each reference-axis half-plane that are farthest from the main plane and spaced from the reference point, the ridgeline subtending a substantial angle about the central axis, and (b) terminating inwardly at the ridgeline. The compound outer lens surface also includes a middle region which is inward of the ridgeline, contains the middle-region reference point, and has a concavity thereabout. The compound outer lens surface further includes a non-principal perimeter surface which is centered on the non-preferential side and adjoins the middle region and the principal perimeter surface.

The inventive apparatus will most typically be used in applications in a multiplicity of such devices are arranged on what is referred to as an LED module, one or more of which are used within a lighting fixture to achieve desired illumination. Roadway and parking lot lighting are such applications, although there are a great many other applications for such devices.

BRIEF DESCRIPTION OF THE DRAWINGS

FIG. 1 is a perspective drawing of one embodiment of the light-directing LED apparatus of the invention.

FIGS. 2-4 are three different views of the apparatus of FIG. 1 with their respective cross-sectional views in FIGS. 2C-4C.

FIGS. 17-19 are three views of the secondary lens of the apparatus of FIG. 1, each depicting a cross-sectional plane intersecting the secondary lens compound outer lens surface along curves the shape of which are determined by one of more target lens design curves.

FIGS. 17C-19C are the cross-sectional views (without background with respect to the secondary lens compound outer lens surface) defined in FIGS. 17-19, respectively, further illustrating the five target lens design curves of the outer surface of the secondary lens of the apparatus of FIG. 1.

DETAILED DESCRIPTION OF PREFERRED EMBODIMENTS

Figure 5:
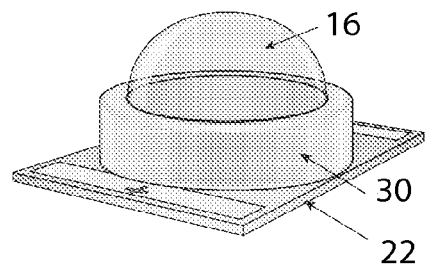
FIG. 5 is perspective view of the primary lens of the inventive apparatus of FIG. 1.
Figure 6:
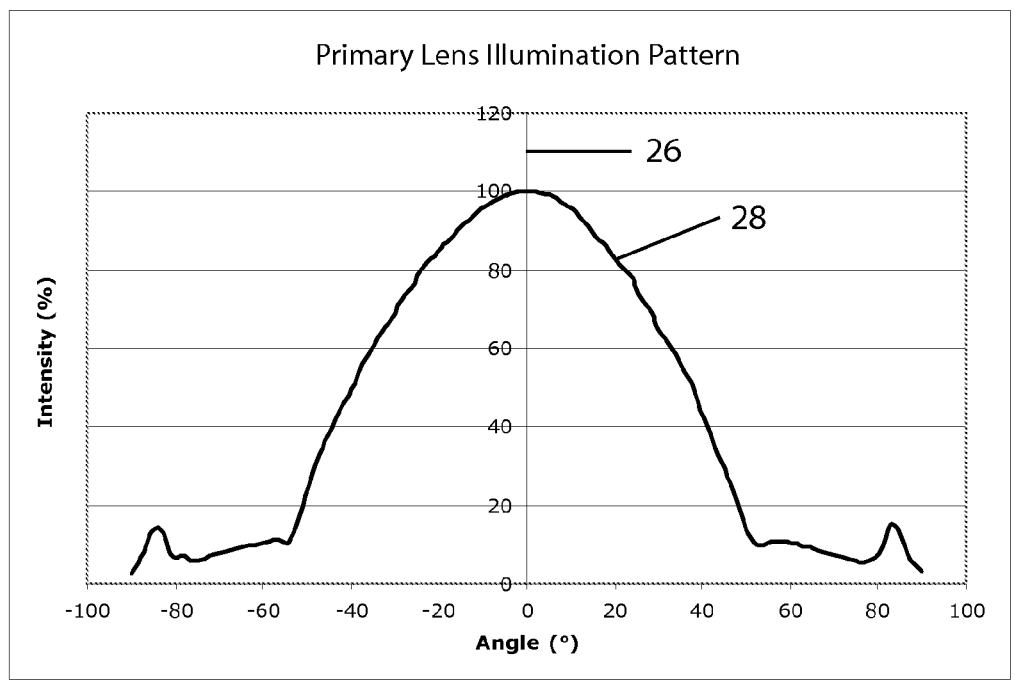
FIG. 6 is graphical representation of the illumination pattern of the primary lens of the apparatus of FIG. 1.

One embodiment of the inventive light-directing LED apparatus is shown in the figures as apparatus 10. Referring to FIGS. 1-5, apparatus 10 includes an LED light emitter 18 mounted a base 22. Light emitter 18 may include one of more LEDs. Light from emitter 18 passes out through a primary lens 16 positioned over light emitter 18. In apparatus 10, lens 16 is hemispherical and made of glass with a refractive index of between 1.4 and 1.6. Primary lens 16 can also be made of other suitable materials such as but not limited to optical-grade silicone. Primary lens 16 has a central axis 26 generally perpendicular to base 22 such that the light passing out through lens 16 from light emitter 18 produces an illumination pattern 28 (typical cross-section shown in FIG. 6) which is substantially rotationally symmetric around central axis 26. Apparatus 10 also includes a ring 30, preferably made of aluminum, around primary lens 10 on base 22 which serves to position lens 16 and to reflect some light from emitter 18 to assist in the generation of illumination pattern 28.

Figure 7:
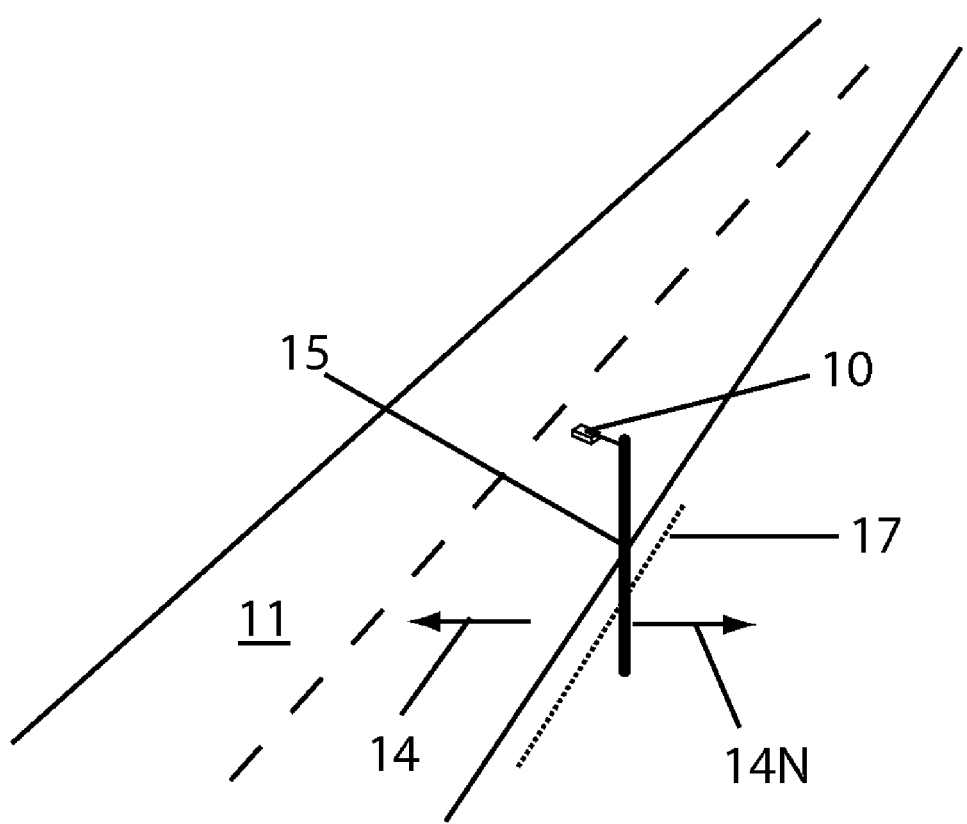
FIG. 7 is schematic representation of a light pole with the inventive apparatus mounted thereon; the pole is positioned along the side of a roadway in perspective view as a typical application of the inventive apparatus of FIG. 1.
Figure 8:
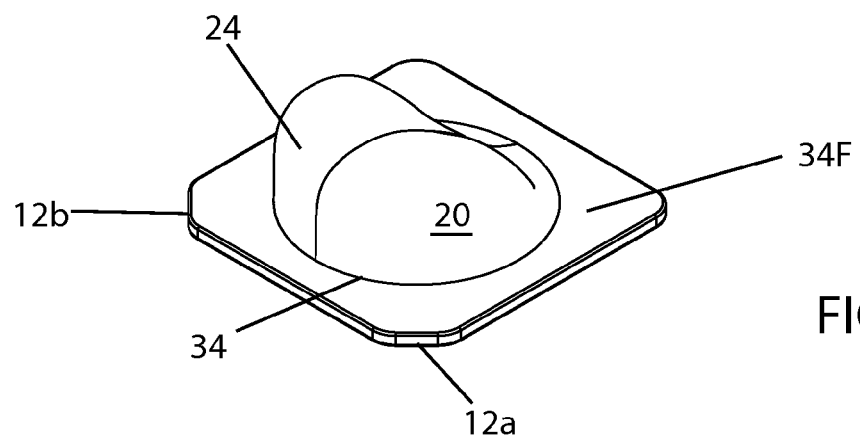
FIG. 8 is a perspective-view line drawing of the secondary lens of the apparatus of FIG. 1 primarily illustrating the compound outer lens surface of the secondary lens.
Figure 9:
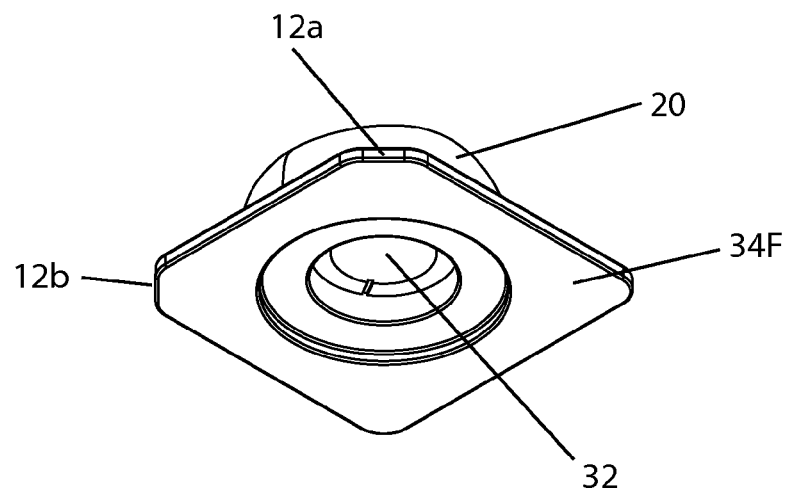
FIG. 9 is a perspective-view line drawing of the secondary lens of the apparatus of FIG. 1 primarily illustrating the side opposite the compound outer lens surface of the secondary lens.
Figure 10:
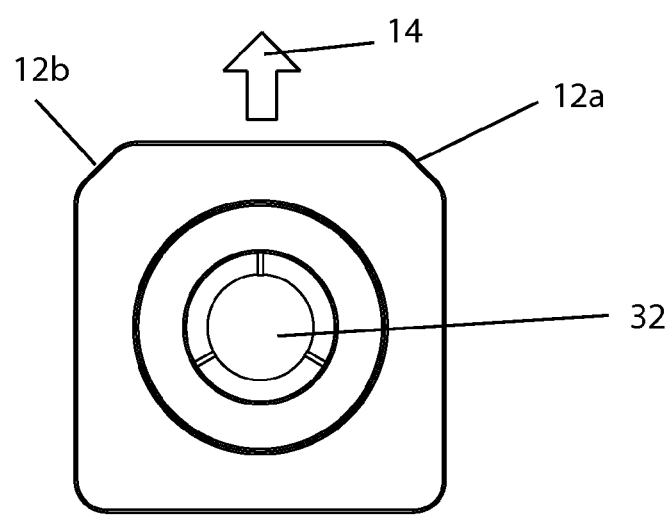
FIG. 10 is a bottom elevation view ("bottom" relative to FIG. 9) of the secondary lens of the apparatus of FIG. 1.
Figure 11:
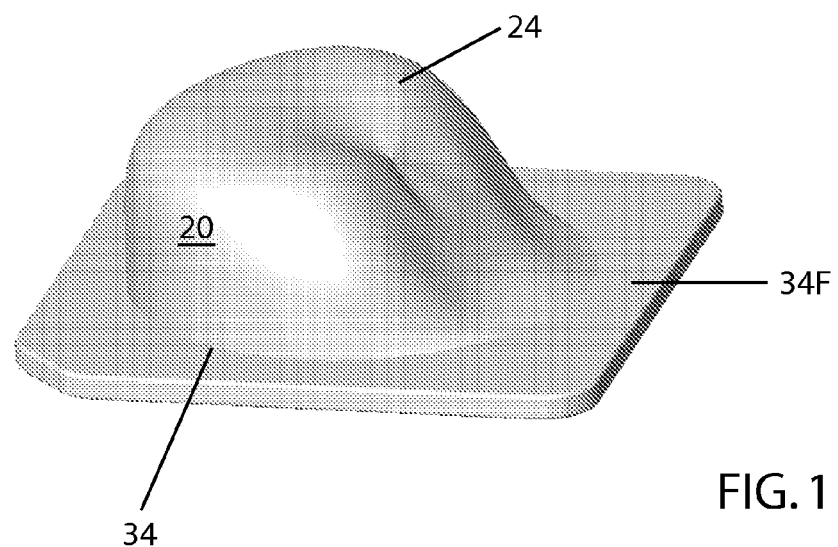
FIGS. 11-13 are CAD-generated solid-model perspective representations of the secondary lens of the apparatus of FIG. 1 from various viewing angles.
Figure 12:
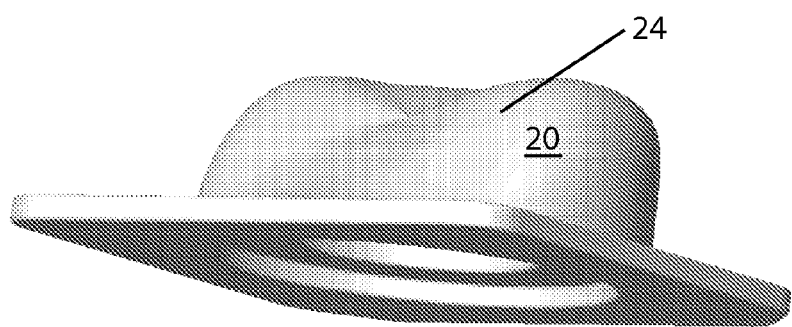
Figure 13:
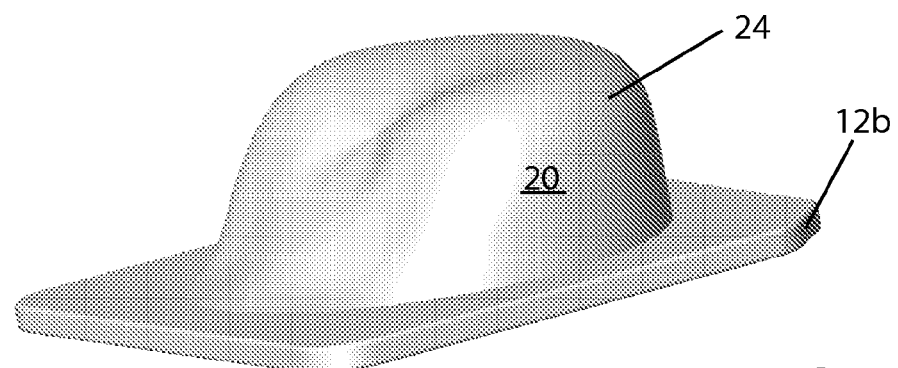
Figure 14:
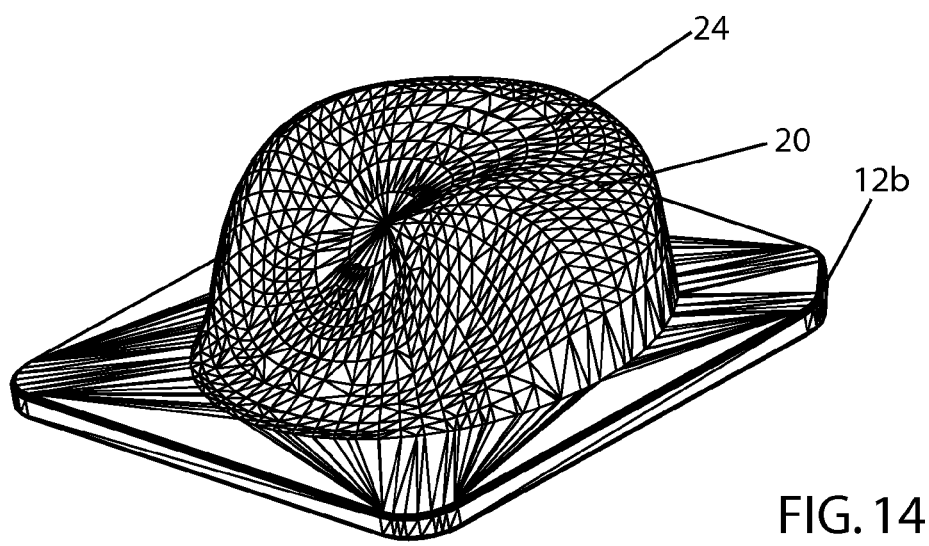
FIG. 14 is a CAD-generated wire-frame model perspective representation of the secondary lens of the apparatus of FIG. 1.
Figure 15:
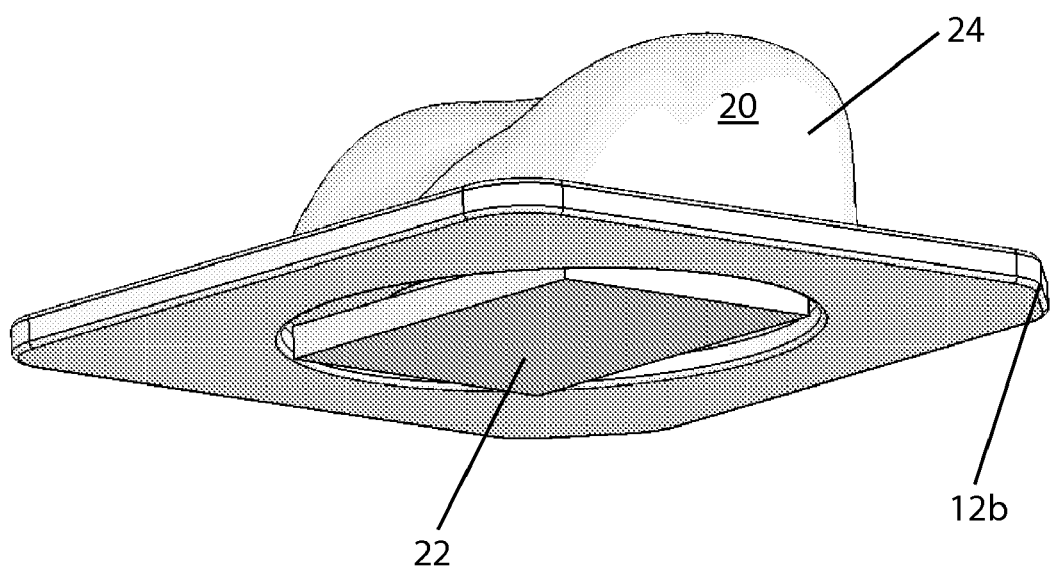
FIG. 15 is a CAD-generated solid-model perspective representation of the apparatus of FIG. 1 showing the base on which the light emitter is mounted positioned within the secondary lens.

Referring now to FIG. 7, a roadway 11 is schematically illustrated with apparatus 10 mounted at the top a light pole 15 installed along roadway 11. Such an application, although not limiting, is typical of how inventive apparatus 10 will be used. The direction arrow marked by reference number 14 indicates a preferential side (roadside), and the direction arrow marked by reference number 14N points toward the opposite, non-preferential side (house-side). Because such an application will be typical, the term "roadside" is also associated with the preferential side and the term "house-side" is associated with the non-preferential side. The terms "roadside" and "house-side" are not to be interpreted as limiting.

Again referring to FIG. 7, apparatus 10 is positioned directly over a curbline 17 which is parallel to roadway 11. Curbline 17 is represented by a shorter dotted line. The term "curbline" as used herein does not refer to the actual position of the curb but to the line as defined above, parallel to roadway 11 and in a plane (not shown) dividing the preferential and non-preferential sides.

Apparatus 10 also includes a secondary lens 20 which has an inner surface 32 which surrounds primary lens 16. In some embodiments, there may be a small space between the primary and secondary lenses. In apparatus 10, such space 19 (see FIG. 2) between primary lens 16 and inner surface 32 is filled with an optical index-matching gel (not shown) to minimize the refractive losses across the interfaces between primary lens 16 and secondary lens 20. In apparatus 10, secondary lens 20 is molded using ultraviolet-stabilized, optical-grade acrylic with a refractive index of 1.51. The purpose of the optical-grade gel is to provide an approximate match to the refractive indices of the primary lens 16 material and the secondary lens 20 material. One suitable gel is SmartGel™ Nye Nyogel® OC431A from Nye Optical Products of Fairhaven, Mass., USA. This gel is an optically-clear index-matching gel with a refractive index of 1.4995 at a wavelength of 402 nm (nanometers). All of these materials are well-known to those skilled in the art of optics and optical systems.

A suitable LED light emitter 18 is the XLamp 7090 manufactured by CREE, Inc. of Durham, N.C., USA. Such light emitter is supplied on its base 22 and with primary lens 16 as part of the package. Primary lens 10 is hemispherical with a diameter of 0.17".

In apparatus 10, secondary lens 20 includes a lower end 34 adjacent to base 22. Lower end 34 defines a main plane 34P parallel to lower end 34, main plane 34P being parallel to the plane of the pages in FIGS. 3, 4, 10, 18, and 19. Secondary lens 20 also includes a flange 34F parallel to main plane 34P. (Main plane 34P is marked with its reference number just once in the figures, in FIG. 16.) As illustrated in FIGS. 1, 2C, 3, 4, 4C, 8, and 14, secondary lens 20 defines preferential side as indicated by reference number 14. Flange 34F of lens 20 includes two broken corners 12$a$ and 12$b$ which also indicate the preferential side of lens 20. FIG. 1 also indicates, by reference number 14N, the direction toward the opposite, non-preferential side (house-side). Based on these definitions, in use, apparatus 10 is aligned such that the preferential side of apparatus 10 is oriented toward the preferential side of the application, as has been illustrated in FIG. 7.

Secondary lens 20 has a compound outer lens surface 24. FIGS. 8-15 illustrate in a general fashion the shape of secondary lens 20 and, in particular, compound outer lens surface 24 as viewed from various angles. The different views of FIGS. 8-15 are included for clarity since compound outer lens surface 24 involves complex shapes to achieve the desired light-directing optical performance of apparatus 10. A number of the figures are CAD-generated solid-model representations of compound outer lens surface 24 which enable one to visualize compound outer lens surface 24 more easily. Only a few reference numbers have been applied to FIGS. 8-15 since the figures are different views of the same elements.

Figure 16:
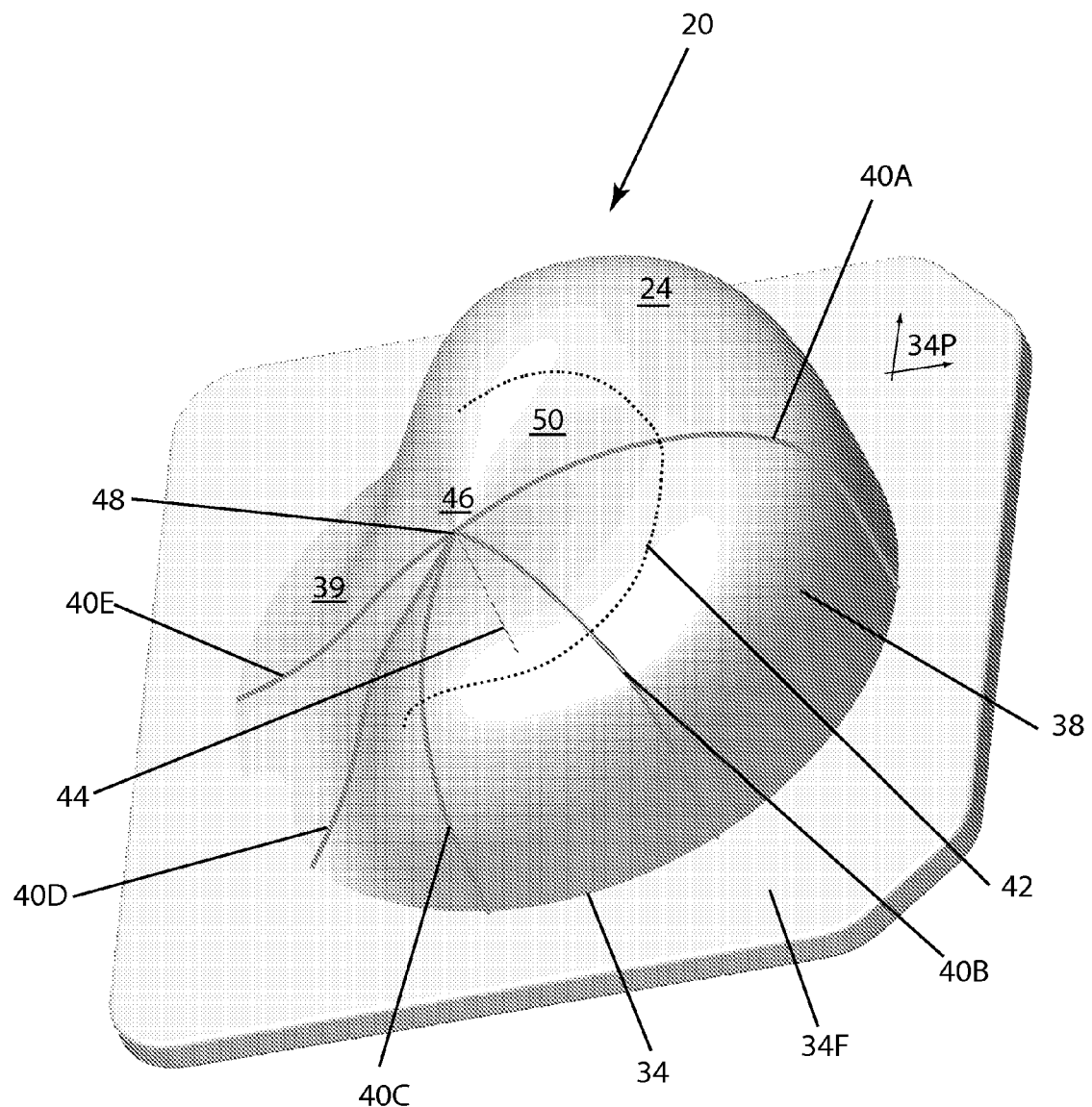
FIG. 16 is a CAD-generated solid-model perspective representation of the secondary lens of the apparatus of FIG. 1 showing five target lens design curves used to generate the outer surface of the secondary lens.

FIGS. 16-19C provide a more detailed description of compound outer lens surface 24. FIG. 16 is an additional CAD-generated solid-model representation of compound outer lens surface 24. Compound outer lens surface 24 has a principal perimeter surface 38 with a middle-region reference point 48 (herein often referred to as reference point 48 for brevity) defining a reference axis 44 parallel to central axis 26. Compound outer lens surface 24 includes principal perimeter surface 38 which is centered on the preferential side as indicated by direction arrow 14. Principal perimeter surface 38 projects from lower end 34 downwardly (upwardly in the figures as noted above) and inwardly to a ridgeline 42 defined by the set of outer-lens-surface points (points on compound outer lens surface 24) in each reference-axis half-plane that are farthest from main plane 34P and spaced from reference point 48. Ridgeline 42 subtends an angle around central axis 44 which is greater than 180°, such angle being measured between line segments 26$a$ and 26$b$ in the direction of the preferential side as indicated by direction arrow 14. (See FIG. 18.) Principal perimeter surface 38 terminates inwardly at ridgeline 42.

Compound outer lens surface 24 also includes a middle region 50 inward of ridgeline 42 and contains middle-region reference point 48. Middle region 50 has a concavity 46 about reference point 48. Compound outer lens surface 24 further includes a non-principal perimeter surface 39 which is centered on the non-preferential side as indicated by direction arrow 14N. Non-principal perimeter surface 39 adjoins a middle region 50 and principal perimeter surface 38.

Figures 19, 19C:
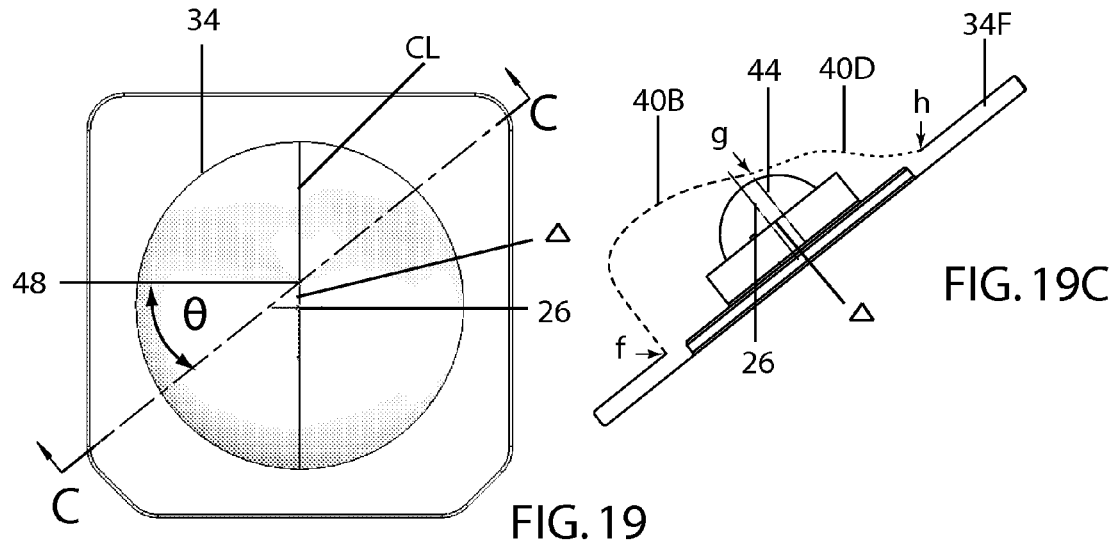
Figures 18, 18C:
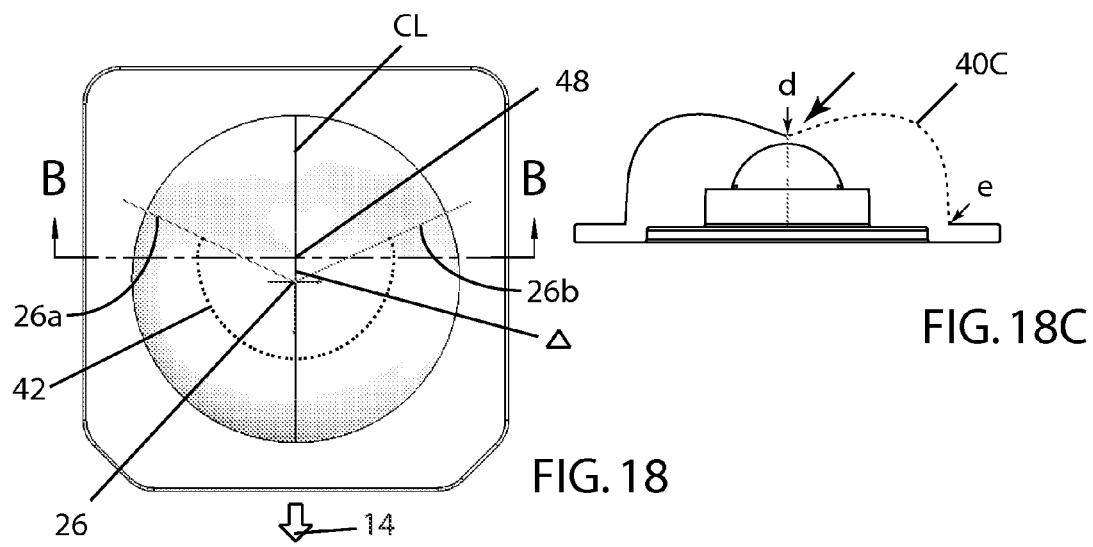
Figures 17, 17C:
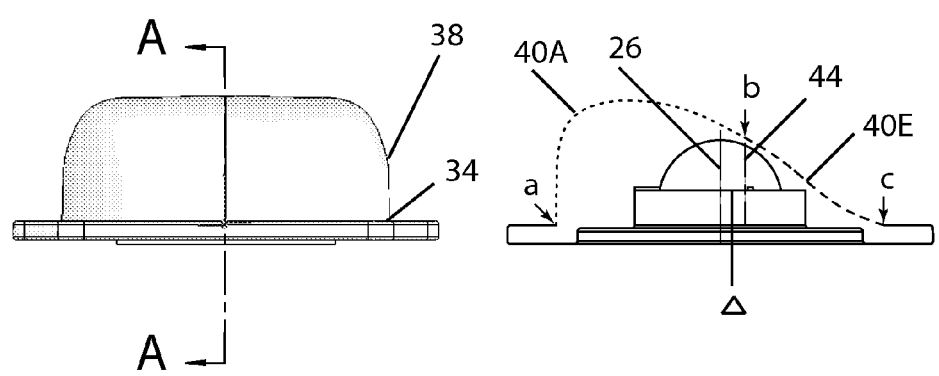

FIGS. 16-19C illustrate the above description of compound outer lens surface 24. Compound outer lens surface 24 is configured by utilizing five target lens design curves 40A-40E as shown in FIG. 16. Compound outer lens surface is bilaterally symmetrical around centerline CL. FIGS. 17-19 and their corresponding cross-sections in FIGS. 17C-19C also illustrate details of the five target lens design curves 40A-40E.

In this embodiment, section A-A defines a plane in which both reference axis 44 (including reference point 48) and centerline CL lie and which plane is perpendicular to main plane 34P. Section B-B defines a plane perpendicular to main plane 34P, perpendicular to section A-A, and containing reference axis 44 and reference point 48. Section C-C defines a plane perpendicular to main plane 34P, oriented at angle θ of approximately 38.7 degrees ($\tan^{-1}(0.8)$ according to chosen specifications) to the plane of section B-B, and containing reference axis 44 and reference point 48. All five target lens design curves 40A-40E have one endpoint at reference point 48.

Reference point 48 is located on a line perpendicular to main plane 34P defining reference axis 44 and displaced a distance Δ from central axis 26 along centerline CL. In this particular embodiment, Δ has a value around 0.040 inches, and the outer diameter of secondary lens 20 at main plane 34P is 0.5". In FIGS. 17C, 18, 19, and 19C, distance Δ is represented by the short portion of the line segment at the end of the reference line from the character Δ. Distance Δ is also indicated in FIG. 4.

Reference arrows a through h help to define the five target lens design curves: curve 40A has endpoints a and b; curve 40B has endpoints f and g; curve 40C has endpoints d and e; curve 40D has endpoints g and h; and curve 40E has endpoints b and c. Endpoints b, d, and g are coincident with and located at reference point 48, and endpoints a, c, e, f, and h are located in main plane 3P at lower end 34. Each of the five target lens design curves 40A-40E is shaped to achieve a desired directing of light along the directions defined by the sections A-A, B-B, and C-C as described above. In other words, each target lens design curve is shaped to satisfy a single or simple set of lens performance criteria along a single direction, enabling an optical engineer to specify a highly complex lens as a set of more-easily-defined criteria.

The five curves 40A-40E meet at reference point 48. Compound outer lens surface 24 is then completed by generating smooth surfaces between the five target design curves 40A-40E using NURBS (non-uniform, rational B-splines), a mathematical smoothing approach used for CAD-system surfacing and other computer graphics applications and well-known to those skilled in the state of the art of CAD and computer graphics technology. Compound outer lens surface 24 is well-defined by the five target lens design curves 40A-40E, the requirement of bilateral symmetry (for this embodiment), and main plane 34P such that compound outer lens surface 24 results in a surface having principal perimeter surface 38, middle region 50, and concavity 46 around reference axis 44.

Other embodiments of this inventive light-directing LED apparatus can be configured through the use of more than or fewer than five target lens design curves, utilizing the power of NURBS to generate compound outer lens surface according to a variety of specified lens design requirements.

Depending on the particular shapes of the target lens design curves (or whatever other method is used to generate the inventive compound outer lens surface of the secondary lens), concavity 46 may vary in relative size and shape within the compound outer lens surface. Further, depending on the technology used to fabricate the secondary lens, the region of concavity around the reference point may be quite small.

Figure 20:
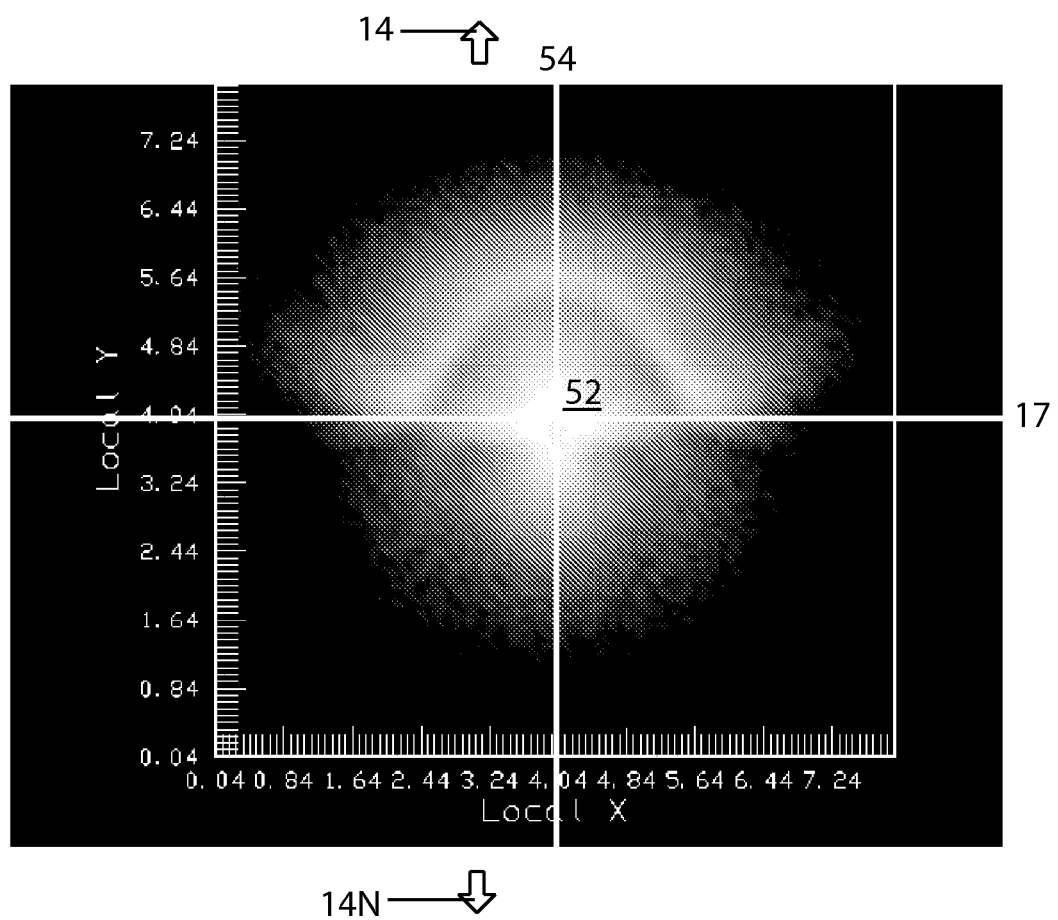
FIG. 20 is a two-dimensional illumination intensity distribution of the inventive apparatus of FIG. 1.

FIG. 20 illustrates a two-dimensional illumination intensity distribution 52 for an embodiment containing a single-light-emitter 18, a single primary lens 16 and a single secondary lens 20. Pattern 52 was generated using optical ray-tracing software to simulate the illumination intensity emanating from inventive apparatus 10. The "Local Y" axis represents the distance behind and in front of the curbline with the curbline being located at the Y=4 position parallel to the "Local X" axis. Values of Y greater than 4 represent the region of the preferential side (roadside) of pattern 52, and values of Y less than 4 represent the region of the non-preferential side (house-side) of pattern 52. The position directly under apparatus 10 in the simulation is positioned at Y=4 and X=4, indicated by the intersection of curbline 17 and line 54. Units of X and Y can be thought of as being in pole lengths, i.e., if the pole is 20 feet high, then the full spans of the X-axis and the Y-axis are 8×20 feet, or 160 feet.

The brightness of illumination pattern 52 in FIG. 20 illustrates the relative intensity distribution, demonstrating that a very large percentage of the light emanating from apparatus 10 is redirected toward the preferential side by secondary lens 20 of apparatus 10 and only a small amount of trespass lighting on the non-preferential side.

Figure 21A:
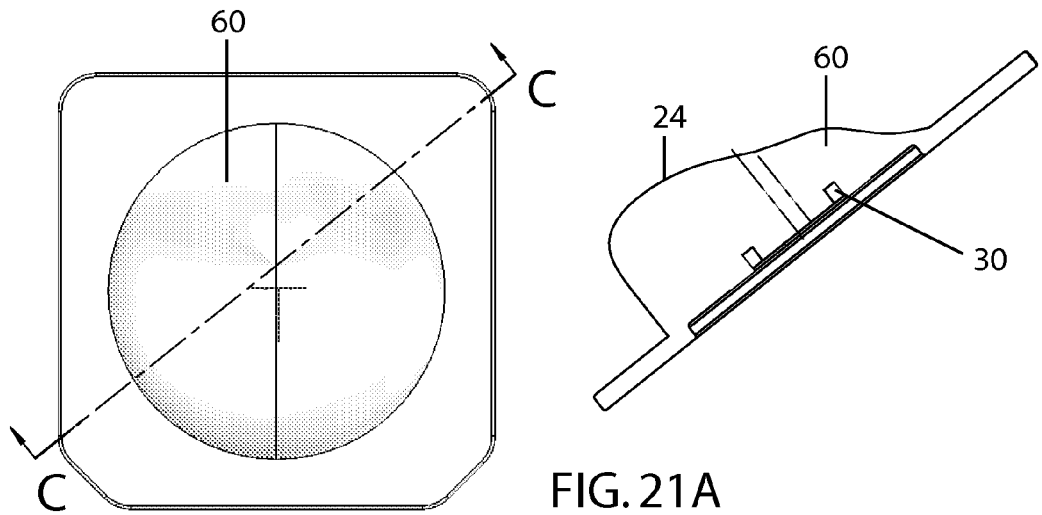
FIGS. 21A-21C illustrate pairs of views of a second embodiment of the inventive light-directing LED apparatus, The second embodiment incorporates an integral lens. Each pair of views defines a cross-sectional plane which is then illustrated in the pair, the views being equivalent to the views of FIGS. 17-19C of the first embodiment of the inventive apparatus.
Figure 21B:
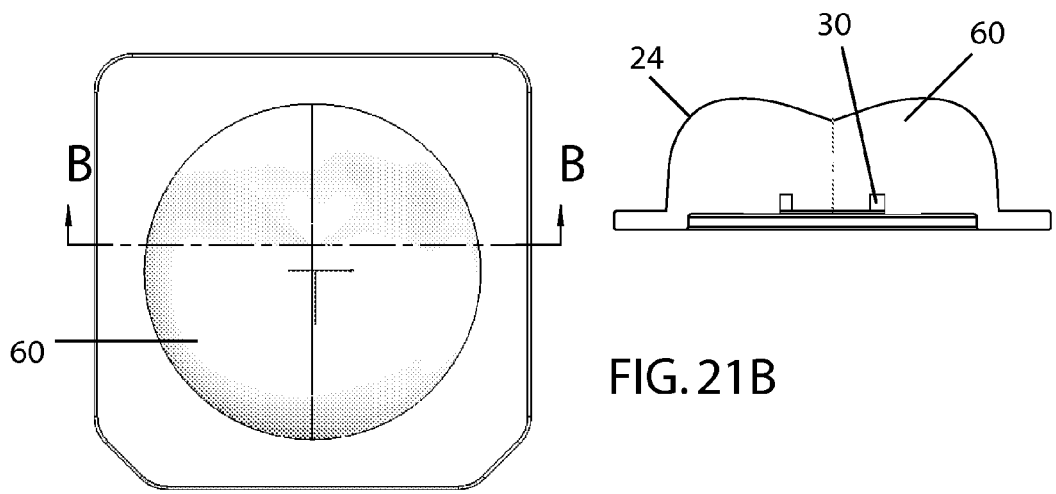
Figure 21C:
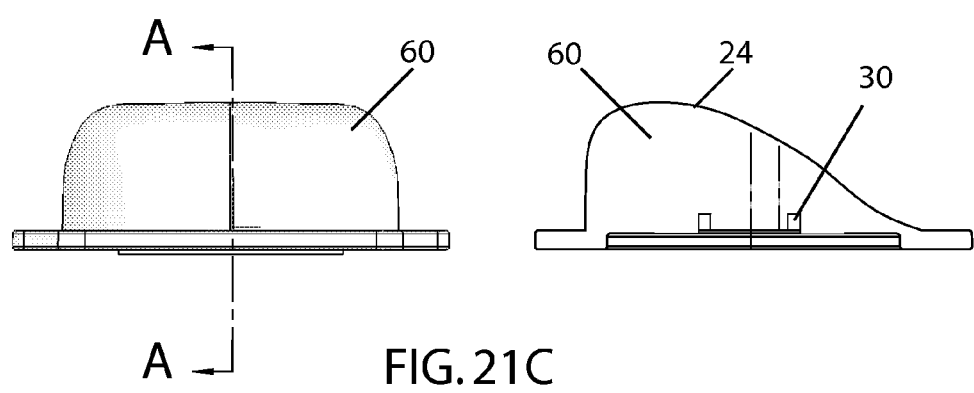

FIGS. 21A-21C show a second embodiment of the secondary lens into which is the primary lens is incorporated. FIGS. 21A-21C correlate with FIGS. 17-19C in all respects except that the primary lens and the secondary lens are an integral lens 60. Integral lens 60 eliminates the need for optical matching gel between the primary and secondary lenses and the optical shortcomings which accompany interfaces between these two lenses. FIGS. 21A-21C show three views of integral lens 60 and the defined cross-sections with no background.

In the second embodiment shown in FIGS. 21A-21C, integral lens 60 is shaped around ring 30. Integral lens 60 can be manufactured with ring 30, preferably made of a reflecting material such as aluminum, formed within lens 60 or lens 60 can be shaped to fit around ring 30.

While the principles of this invention have been described in connection with specific embodiments, it should be understood clearly that these descriptions are made only by way of example and are not intended to limit the scope of the invention.

The invention claimed is:

1. LED apparatus for illumination toward a preferential side in a downward and outward direction, comprising:
   a light emitter having at least one LED on a base;
   a primary lens positioned over the light emitter and having a central axis;
   a secondary lens placed with an inner surface surrounding the primary lens, the secondary lens having (a) a base-adjacent lower end defining a main plane substantially perpendicular to the central axis and (b) a compound outer lens surface with a middle-region reference point defining a reference axis parallel to the central axis, the compound outer lens surface including:
      a principal perimeter surface centered on the preferential side, the principal perimeter surface (a) projecting from the base-adjacent end downwardly and inwardly to a ridgeline defined by the set of outer-lens-surface points in each reference-axis half-plane that are farthest from the main plane and spaced from the reference point, the ridgeline subtending a substantial angle about the central axis, and (b) terminating inwardly at the ridgeline;

a middle region inward of the ridgeline, containing the middle-region reference point and having a concavity thereabout; and a non-principal perimeter surface centered on the non-preferential side and adjoining the middle region and the principal perimeter surface.

2. The LED apparatus of claim 1 wherein the reference axis is offset from the central axis toward the non-preferential side.

3. The LED apparatus of claim 1 wherein the ridgeline subtends an angle greater than 180° about the central axis.

4. The LED apparatus of claim 3 wherein the reference axis is offset from the central axis toward the non-preferential side.

5. The LED apparatus of claim 1 wherein there is only a single ridgeline point in each reference-axis half-plane intersecting the principal perimeter surface.

6. The LED apparatus of claim 1 wherein the principal perimeter surface is bilaterally symmetric.

7. The LED apparatus of claim 1 wherein the non-principal perimeter surface is bilaterally symmetric.

8. The LED apparatus of claim 1 wherein the compound outer lens surface is bilaterally symmetric.

9. The LED apparatus of claim 1 wherein there is space between the primary and secondary lenses and the space is filled with optical-grade gel.

10. The LED apparatus of claim 1 wherein the primary lens has an illumination pattern which is substantially rotationally symmetrical around the central axis.

11. The LED apparatus of claim 1 wherein the primary lens is substantially hemispherical.

12. The LED apparatus of claim 1 wherein the compound outer lens surface is shaped by (a) a plurality of spaced-apart target lens design curves in reference-axis half-planes, the curves terminating at the middle-region reference point and the base-adjacent end, and (b) surfaces which smoothly match the plurality of target lens design curves between the curves.

13. The LED apparatus of claim 12 wherein the reference axis is offset from the central axis toward the non-preferential side.

14. The LED apparatus of claim 12 wherein the ridgeline subtends an angle greater than 180° about the central axis.

15. The LED apparatus of claim 14 wherein the reference axis is offset from the central axis toward the non-preferential side.

16. The LED apparatus of claim 12 wherein there is only a single ridgeline point in each reference-axis half-plane intersecting the principal perimeter surface.

17. The LED apparatus of claim 12 wherein the principal perimeter surface is bilaterally symmetric.

18. The LED apparatus of claim 12 wherein the non-principal perimeter surface is bilaterally symmetric.

19. The LED apparatus of claim 12 wherein the compound outer lens surface is bilaterally symmetric.

20. The LED apparatus of claim 12 wherein there is space between the primary and secondary lenses and the space is filled with optical-grade gel.

21. The LED apparatus of claim 12 wherein the primary lens has an illumination pattern which is substantially rotationally symmetrical around the central axis.

22. The LED apparatus of claim 12 wherein the primary lens is substantially hemispherical.

23. LED apparatus for illumination toward a preferential side in a downward and outward direction, comprising:

a light emitter having at least one LED on a base;

a lens positioned over the light emitter and having a central axis, a base-adjacent end defining a main plane substantially perpendicular to the central axis, and a compound outer lens surface with a middle-region reference point defining a reference axis parallel to the central axis, the compound outer lens surface including:

a principal perimeter surface centered on the preferential side, the principal perimeter surface (a) projecting from the base-adjacent end downwardly and inwardly to a ridgeline defined by the set of outer-lens-surface points in each reference-axis half-plane that are farthest from the main plane and spaced from the reference point, the ridgeline subtending a substantial angle about the central axis, and (b) terminating inwardly at the ridgeline;

a middle region inward of the ridgeline, containing the middle-region reference point and having a concavity thereabout; and a non-principal perimeter surface centered on the non-preferential side and adjoining the middle region and the principal perimeter surface.

24. The LED apparatus of claim 23 wherein the reference axis is offset from the central axis toward the non-preferential side.

25. The LED apparatus of claim 23 wherein the ridgeline subtends an angle greater than 180° about the central axis.

26. The LED apparatus of claim 25 wherein the reference axis is offset from the central axis toward the non-preferential side.

27. The LED apparatus of claim 23 wherein there is only a single ridgeline point in each reference-axis half-plane intersecting the principal perimeter surface.

28. The LED apparatus of claim 23 wherein the principal perimeter surface is bilaterally symmetric.

29. The LED apparatus of claim 23 wherein the non-principal perimeter surface is bilaterally symmetric.

30. The LED apparatus of claim 23 wherein the compound outer lens surface is bilaterally symmetric.

31. The LED apparatus of claim 23 wherein the compound outer lens surface is shaped by (a) a plurality of spaced-apart target lens design curves in reference-axis half-planes, the curves terminating at the middle-region reference point and the base-adjacent end, and (b) surfaces which smoothly match the plurality of target lens design curves between the curves.

32. The LED apparatus of claim 31 wherein the reference axis is offset from the central axis toward the non-preferential side.

33. The LED apparatus of claim 31 wherein the ridgeline subtends an angle greater than 180° about the central axis.

34. The LED apparatus of claim 33 wherein the reference axis is offset from the central axis toward the non-preferential side.

35. The LED apparatus of claim 23 wherein there is only a single ridgeline point in each reference-axis half-plane intersecting the principal perimeter surface.

36. The LED apparatus of claim 31 wherein the principal perimeter surface is bilaterally symmetric.

37. The LED apparatus of claim 31 wherein the non-principal perimeter surface is bilaterally symmetric.

38. The LED apparatus of claim 31 wherein the compound outer lens surface is bilaterally symmetric.

* * * * *

UNITED STATES PATENT AND TRADEMARK OFFICE
CERTIFICATE OF CORRECTION

| | | |
|---|---|---|
| PATENT NO. | : 7,618,163 B2 | Page 1 of 1 |
| APPLICATION NO. | : 11/695483 | |
| DATED | : November 17, 2009 | |
| INVENTOR(S) | : Wilcox | |

It is certified that error appears in the above-identified patent and that said Letters Patent is hereby corrected as shown below:

Title Pg, Item (57) Abstract, line 6, after adjacent, delete "lower".

In column 1, line 45, after non-preferential, insert --side--.

In column 4, line 17, delete "in" and insert --wherein--.

In column 4, line 64, delete "of" and insert --or--.

In column 5, line 20, after mounted, insert --on--.

In column 5, line 20, delete "of" and insert --or--.

In column 5, line 30, delete "," and insert --.--.

In column 6, line 13, after the, insert --drawing--.

In column 7, line 36, delete "3P" and insert --34P--.

In column 10, claim 35, line 55, delete "23" and insert --31--.

Signed and Sealed this
Thirteenth Day of September, 2011

David J. Kappos
*Director of the United States Patent and Trademark Office*